United States Patent
Gouterman et al.

(10) Patent No.: US 7,412,680 B1
(45) Date of Patent: Aug. 12, 2008

(54) METHOD AND APPARATUS FOR PERFORMING INTEGRATED GLOBAL ROUTING AND BUFFER INSERTION

(75) Inventors: Vadim Gouterman, Toronto (CA); Vaughn Betz, Toronto (CA); Mark Bourgeault, Mississauga (CA)

(73) Assignee: Altera Corporation, San Jose, CA (US)

( * ) Notice: Subject to any disclaimer, the term of this patent is extended or adjusted under 35 U.S.C. 154(b) by 78 days.

(21) Appl. No.: 11/227,680

(22) Filed: Sep. 15, 2005

(51) Int. Cl.
G06F 17/50 (2006.01)
(52) U.S. Cl. .................... 716/10; 716/6; 716/18
(58) Field of Classification Search .......... 716/6, 716/10, 18
See application file for complete search history.

(56) References Cited

U.S. PATENT DOCUMENTS

| | | | | |
|---|---|---|---|---|
| 5,580,598 A * | 12/1996 | Benson et al. | | 426/438 |
| 6,347,393 B1 * | 2/2002 | Alpert et al. | | 716/2 |
| 6,907,592 B1 * | 6/2005 | Dante | | 716/12 |
| 6,996,512 B2 * | 2/2006 | Alpert et al. | | 703/14 |
| 7,065,730 B2 * | 6/2006 | Alpert et al. | | 716/13 |
| 7,098,687 B1 * | 8/2006 | Leventis et al. | | 326/41 |
| 7,149,997 B1 * | 12/2006 | Young et al. | | 716/16 |
| 7,231,459 B2 * | 6/2007 | Saraph et al. | | 709/241 |
| 7,251,800 B2 * | 7/2007 | McElvain et al. | | 716/12 |
| 2003/0005153 A1 * | 1/2003 | Carbonell | | 709/239 |
| 2003/0028852 A1 * | 2/2003 | Thurman et al. | | 716/12 |
| 2003/0088842 A1 * | 5/2003 | Cirit | | 716/9 |
| 2004/0068626 A1 * | 4/2004 | Alpert et al. | | 711/158 |
| 2004/0117753 A1 * | 6/2004 | Kahng et al. | | 716/12 |
| 2004/0193729 A1 * | 9/2004 | Saraph | | 709/241 |
| 2004/0205239 A1 * | 10/2004 | Doshi et al. | | 709/241 |
| 2005/0138589 A1 * | 6/2005 | Alpert et al. | | 716/10 |
| 2006/0043427 A1 * | 3/2006 | Komoda et al. | | 257/210 |
| 2006/0190899 A1 * | 8/2006 | Migatz et al. | | 716/13 |
| 2006/0236018 A1 * | 10/2006 | Dao et al. | | 710/317 |
| 2006/0248488 A1 * | 11/2006 | Habitz et al. | | 716/10 |
| 2007/0204252 A1 * | 8/2007 | Furnish et al. | | 716/10 |

* cited by examiner

*Primary Examiner*—Jack Chiang
*Assistant Examiner*—Suchin Parihar
(74) *Attorney, Agent, or Firm*—L. Cho

(57) ABSTRACT

A method for designing a system on an integrated circuit includes synthesizing the system. The system is placed on the integrated circuit. Buffer insertion is performed while selecting new branch points during routing of the system.

21 Claims, 10 Drawing Sheets

US 7,412,680 B1

METHOD AND APPARATUS FOR PERFORMING INTEGRATED GLOBAL ROUTING AND BUFFER INSERTION

TECHNICAL FIELD

The present invention relates to electronic design automation (EDA) tools. More specifically, the present invention relates to a method and apparatus for performing buffer insertion during routing in an EDA tool.

BACKGROUND

Buffer insertion provides a number of benefits in electronic systems. Unbuffered connections exhibit quadratic delay growth with increasing distance between source and destination. Insertion of buffers along connections limits the quadratic growth of the delay and makes the growth close to linear. Buffers may also be used to isolate connections to minimize delays along timing critical connections at the expense of non-timing critical connections, reduce signal transition time, improve signal integrity, and slow down signals to improve hold time margins.

Most commercially available EDA tools insert buffers either before and/or after routing without integrating buffer insertion decisions with routing decisions. For example, some commercial tools predict a net topology for a given net in isolation from other nets after placement, when the location of each net's source and destinations are known. Based on the predicted net topology, the tools will select buffer locations that would be optimal for the predicted topology. A routing procedure would then attempt to connect the inserted buffers to sources, sinks, and other buffers. The routed circuit would be analyzed. Unused and suboptimal buffers would be removed from the circuit, and additional buffers would be added where required. The resulting layout would then be passed back to the router. Iterations between the routing procedure and buffer insertion would continue until convergence was achieved. This approach proved to be suboptimal because it selects net topologies and buffer locations one at a time in isolation, ignoring interactions between nets, congestion, and routing blockages.

Thus, what is needed is an efficient method and apparatus for performing buffer insertion during routing.

SUMMARY

According to an embodiment of the present invention, buffer placement is performed with the routing of a system onto an integrated circuit chip. In one embodiment, buffer placement is performed in the context of other nets and multiple pins (destinations) of the same net. Whenever a routing procedure explores a location or routing resource where buffer insertion is possible, the routing procedure checks if using the buffer would be advantageous for the net timing, signal integrity, transition time, and/or satisfying other goals. The routing procedure compares the cost of a solution which immediately buffers using a routing resource with the cost of a solution which buffers at another routing resource.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
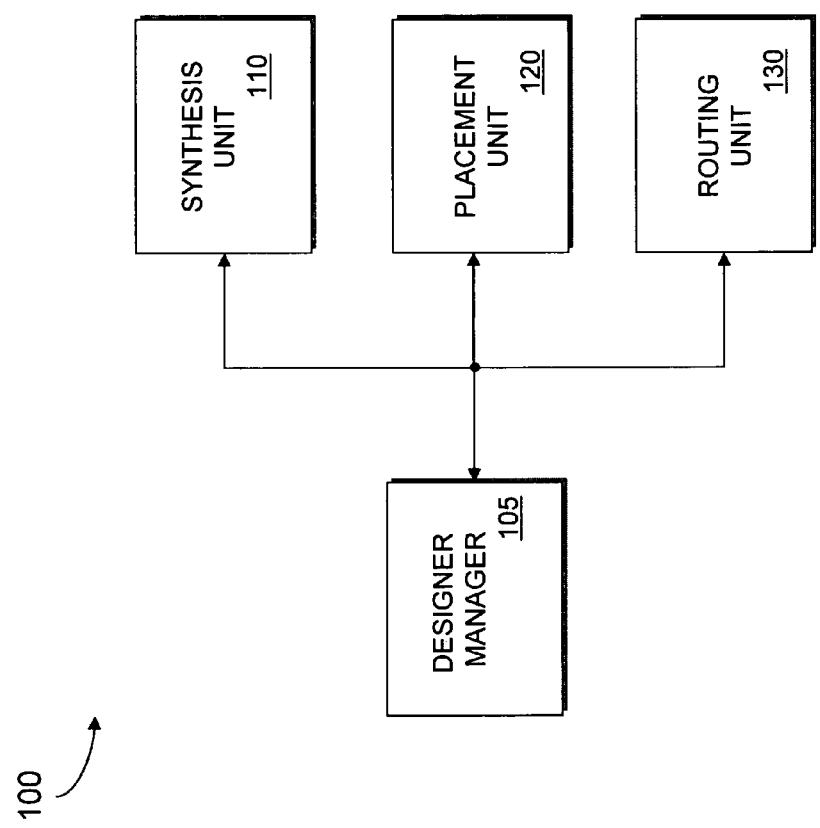
FIG. 1 illustrates a system designer according to an embodiment of the present invention.

FIG. 1 illustrates a system designer 100 according to an embodiment of the present invention. The system designer 100 may be an EDA tool for designing a system on an integrated circuit. The integrated circuit may be, for example, an application specific integrated circuit (ASIC), a structured application specific integrated circuit (Structured ASIC), a field programmable gate array (FPGA) or other circuitry. Furthermore the integrated circuit may be implemented using semiconductor or nanoelectronic technology. FIG. 1 illustrates software modules implementing an embodiment of the present invention. According to one embodiment, system design may be performed by a computer system (not shown) executing sequences of instructions represented by the software modules shown in FIG. 1. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 100 includes a designer manager 105. The designer manager 105 is connected to and transmits data between the components of the system designer 100.

Block 110 represents a synthesis unit. The synthesis unit 110 generates a logic design of a system to be implemented in the integrated circuit or other target device. According to an embodiment of the system designer 100, the synthesis unit 110 takes a conceptual Hardware Description Language (HDL) design definition and generates an optimized logical representation of the system. The optimized logical representation of the system generated by the synthesis unit 110 may include a representation that has a minimized number of functional blocks and registers, such as logic gates and logic elements, required for the system. Alternatively, the optimized logical representation of the system generated by the synthesis unit 110 may include a representation that has a reduced depth of logic and that generates a lower signal propagation delay. The synthesis unit 110 also determines how to implement the functional blocks and registers in the optimized logic representation utilizing specific resources on a target integrated circuit thus creating an optimized "technology-mapped" netlist. The technology-mapped netlist illustrates how the resources on the integrated circuit are utilized to implement the system. In an embodiment where the integrated circuit is an ASIC, the components could be gates or standard cells. In an embodiment where the integrated circuit is a structured ASIC, the technology-mapped netlist may contain components that can be implemented in the structured ASIC fabric, such as RAM blocks, multiplier blocks, and gates from a library of implementable gates.

Block 120 represents a placement unit 120. The placement unit 120 helps map the system on to the integrated circuit by determining which resources or areas on the integrated circuit are to be used for specific functional blocks and registers. According to an embodiment of the system designer 100, the placement unit 120 first determines how to implement portions of the optimized logic design in clusters. Clusters may represent a subset of the components on the integrated circuit. In an embodiment where the integrated circuit is an ASIC, a cluster may be represented, for example, by a number of standard cells grouped together. In this embodiment, after portions of the optimized logic design are implemented in clusters, the clusters may be placed by assigning the clusters to specific positions on the integrated circuit. The placement unit 120 may utilize a cost function in order to determine a good assignment of resources on the integrated circuit.

Block 130 represents a routing unit 130. The routing unit 130 determines the routing resources on the integrated circuit to use to provide interconnection between the functional blocks and registers on the integrated circuit. According to an embodiment of the system designer 100, the routing unit 130 assesses the utility of buffer insertion (splitting a net into two sub-nets with a buffer and placing the buffer at a some location) with each routing option and selects routing options based on the assessment. The routing unit 130 may use a cost function to generate a total cost associated with each routing option. The cost function may take into account, delay, cross-sink loading, capacitive loading on a net, power and/or other criteria.

Figure 2:
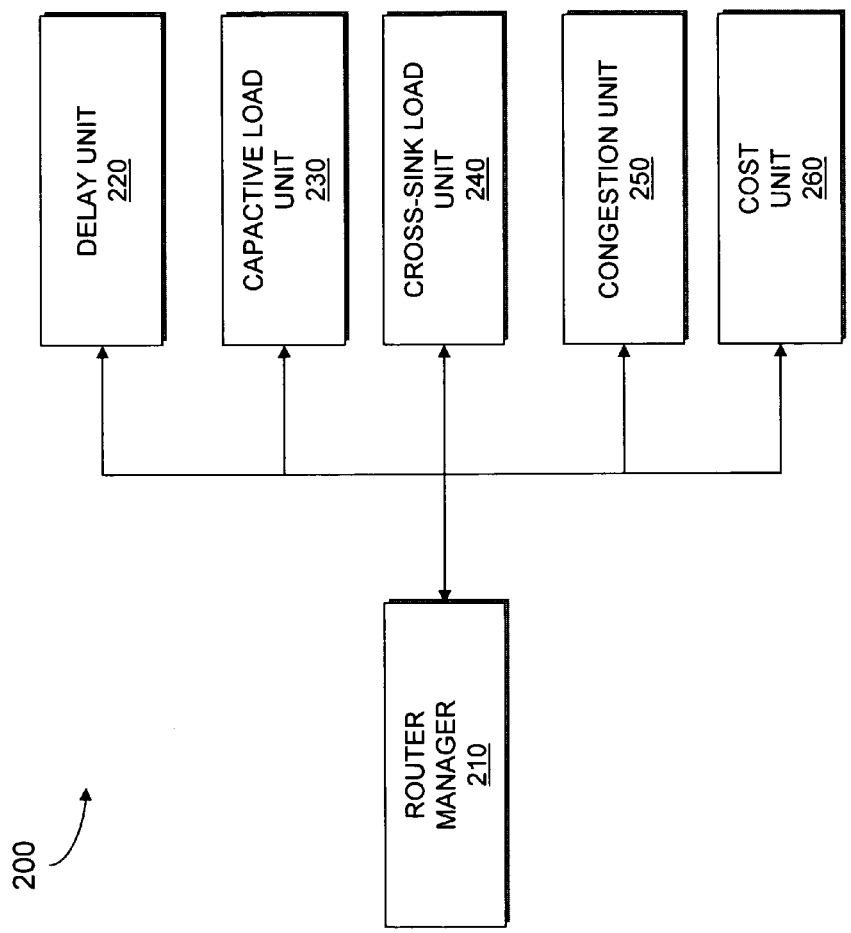
FIG. 2 is a block diagram of a routing unit according to an embodiment of the present invention.

FIG. 2 is a block diagram of a routing unit 200 according to an embodiment of the present invention. The routing unit 200 may be used to implement the routing unit 130 shown in FIG. 1. The routing unit includes a routing manager 210. The routing manager 210 interfaces with and transmits information between components in the routing unit 200. According to an embodiment of the routing unit 200, the routing manager 210 determines a routing path for each net at a time. Furthermore, an embodiment of the routing unit determines a routing path for each of the source-sink connections, which together form a complete net, one at a time. In this embodiment, the routing manager 210 identifies routing resources that are available at different points of exploration. The routing resources may include resources such as wires of differing lengths, widths, directions, and/or properties. The routing manager 210 may use the source of a net as a first point of exploration and then use the routing resources from partial routing as points of exploration as routing resources are later selected. The procedure of exploring a routing resource is often referred to as performing an expansion of that routing node.

The routing unit 200 includes a delay unit 220. The delay unit 220 determines a delay cost associated with routing the net using the routing resources identified by the routing manager 210 with a buffer (immediately buffered solution) and a delay cost associated with routing the net using the routing resource identified by the routing manager 210 without a buffer (future buffered solution). According to an embodiment of the routing unit 200, the delay unit 220 calculates the delay cost of an immediate buffered solution by using a first cost function that takes into account the cost and delay of a routing resource up to the current point (backward cost and delay), the cost and the delay of the buffer placed at a current point, and the cost and delay of an optimally buffered solution from the point of exploration to the destination of the net (lookahead cost and delay). The delay unit 220 calculates the delay cost of a future buffered solution by using the first cost function that takes into account the cost and delay of a routing resource up to the point of exploration (backward cost and delay), the cost of the delay of the routing resource at a current point, and the cost and delay of an optimally buffered solution from the point of exploration to the destination of the net (lookahead cost and delay). It should be appreciated that when determining a cost of a routing option with a buffer, a plurality of buffers may be considered where the buffers have differing properties, such as drive strengths and other properties.

According to an embodiment of the present invention, the cost and delay calculation may be based on Elmore delay, where at every expansion point the routing unit 200 remembers the cumulative upstream resistance back to the driving block. This driving block will either be the functional block driving this net, or a buffer that was previously chosen to be inserted between that functional block and the current expansion point. Exemplary pseudo code of the delay calculation made by the routing unit 200 is shown below.

```
for a given source:
  upstream resistance←output resistance of driver;
  delay to this node←0;
during expansion:
  if (explored node is a buffer) {
    delay to this node←(delay to previous node)+(upstream
        resistance) * (driver input capacitance);
    upstream resistance←output resistance of buffer;
  } else {
    delay to this node←(delay to previous node)+(upstream
        resistance) * (node capacitance)+(node capacitance)
        * (node resistance)/2;
    upstream resistance←(previous upstream resistance)+
        (node resistance);
  }
  total delay←(delay to this node)+(future perfectly buffered
      delay);
```

Figure 3:
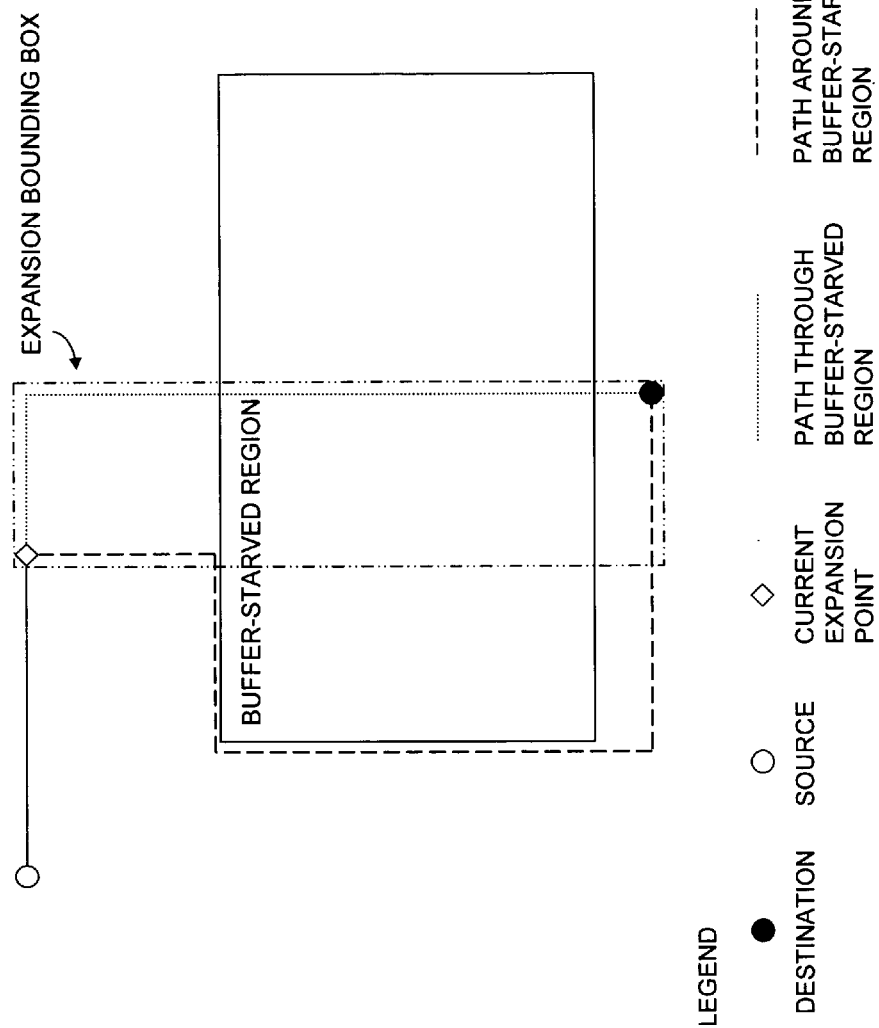
FIG. 3 illustrates an example of where future delay may be adjusted to account for a future buffer starved region.

The optimally buffered future delay may be calculated assuming no routing blockages and that no buffer-starved regions exist between the point of exploration and the sink of the net. It should be appreciated that the optimally buffered future delay may also be calculated by accounting for situations where the point of exploration is inside a buffer-starved region. The delay in this case is the sum of the unbuffered delay to the end of the buffer-starved region and optimally buffered routing from the end of the buffered-starved region to the sink. Furthermore, the optimally buffered future delay may be adjusted to account for situations where a bounding box of a current expansion point and target is completely overlapped with a buffer-starved region. FIG. 3 illustrates an example of where the optimally buffered future delay may be adjusted to account for a buffer-starved region. It should be appreciated that the optimally buffered future delay may account for the buffered-starved region by adding a small constant cost term or alternatively account for routing resources that route around the buffer-starved region.

Referring back to FIG. 2, the routing unit 200 includes a capacitive load unit 230. The capacitive load unit 230 calculates a capacitive loading cost associated with routing the net using the routing resources identified by the routing manager 210 with a buffer (immediate buffered solution) and a capacitive loading cost associated with routing the net using the routing resources identified by the routing manager 210 without a buffer (future buffered solution). According to an embodiment of the routing unit 200, the capacitive load of a driver, such as a source or inserted buffer, is the effective capacitance of the routing tree driven by the driver, and a capactive load cost is computed based on this capacitive load. The capacitive load unit 230 may also calculate transition time and cost and signal integrity cost associated with routing the net with the routing resources with a buffer and without a buffer.

The routing unit 200 includes a cross-sink load unit 240. The cross-sink load unit 240 calculates a cross-sink loading cost associated with routing the net using the routing resources identified by the routing manager 210 with a buffer (immediately buffered solution) and a cross-sink loading cost associated with routing the net using the routing resource identified by the routing manager 210 without a buffer (future buffered solution). Cross-sink loading takes into account the effect capacitive loading generated from a routing strategy for a first connection may have on a routing strategy for a second connection on that same net.

The routing unit 200 includes congestion unit 250. The congestion unit calculates congestion cost associated with routing the net using the routing resources identified by the routing manager 210 with a buffer (immediately buffered solution) and a congestion cost associated with routing the net using the routing resource identified by the routing manager 210 without a buffer (future buffered solution). Exemplary pseudo code of the delay calculation made by the routing unit 200 is shown below.

```
for a given source:
  lookbehind congestion cost←sink base cost;
  lookahead congestion cost←sum of base costs of buffers
      and wires required for future perfectly buffered connection;
  congestion cost←lookbehind congestion cost + lookahead
      congestion cost
during expansion:
  if (current node capacity ≦ current node occupancy) {
    current node overuse penalty←weight * (current node
        occupancy – current node capacity) * historic overuse
        measure
  } else {
    current node overuse penalty←0;
  }
  lookbehind congestion cost←lookbehind congestion cost
      to previous mode+current node base cost+current node
      overuse penalty+current node historic overuse penalty;
after net is routed:
foreach node from net routing {
  node occupancy←node occupancy+1;
  if (node capacity < node occupancy) {
    increase historic overuse measure;
  }
}
```

It should be appreciated that nodes in the exemplary pseudo code include both wires and buffers. In the preferred implementation base costs of wires and buffers are equal to delay accumulated on these buffers and wires under nominal conditions. In alternative implementation base costs are selected to reflect portion of integrated circuit used by specific type of wire or buffer.

The routing unit 200 includes a cost unit 260. The cost unit 260 calculates a total cost for the routing options available for routing the connection. The routing options may include routing resources identified for routing the connection with a buffer and without a buffer. The total cost may include one or more of the cost values identified by the delay unit 220, capacitive load unit 230, cross-sink load unit 240, congestion unit 250, or other criteria identified elsewhere. It should be appreciated that the total cost may account for timing, congestion, signal integrity, power consumption, and other factors.

It should be appreciated that the routing unit 200 may be implemented by astar routers. Delay cost may be determined using the following relationship.

delay cost←alpha * ((delay to this node)+astar * (future perfectly buffered delay))

The preferred way to include delay-related cost component into the cost function can be expressed with the following relationship.

cost←(other cost components)+(delay related cost component)

In the context of a timing-driven router that uses net or connection criticalities, alpha may be a measure of a net or connection criticality. According to an embodiment of the present invention alpha may be high for connections with tight timing constraints and low for connections with loose timing constraints. Furthermore, in the context of a timing-driven router that uses delay budgets, the calculated total delay may be compared with the assigned delay budget. In one possible implementation, a penalty may be assigned if the total delay exceeds the allocated delay budget. The penalty component of the cost may be expressed with the following relationship.

penalty cost component←A * |(total delay) – (delay budget)|$^{beta}$

The penalty cost component may be introduced into the cost function in the following manner.

cost←(other cost components)+(penalty cost component)

According to one embodiment, beta is a positive number. Beta may be set to 2, 1, or dynamically selected for different nets. Alternatively, expansions with total delay exceeding the allocated delay budget may be pruned, which is equivalent to assigning infinite cost to the expansion. It should be appreciated that expansions with total delay exceeding allocated budget delay may be accepted where a final solution with total delay exceeding an allocated delay budget is marked as illegal.

The router manager 210 receives the total cost associated with each routing option available at each point of exploration and selects a routing option based upon its total cost. According to an embodiment of the router unit 200, the router manager selects a routing option with the lowest total cost. If the selected routing option completes the routing for the connection (allows it to reach its destination), the router manager 210 proceeds to a next connection to identify routing resources that are available at a point of exploration on the next connection. If all the connections in a net have been routed, the router manager 210 proceeds to a next connection on a next net. If the selected routing option does not complete the routing of the connection, routing resources are identified at a next point of exploration on the same connection for the delay unit 220, capacitive load unit 230, cross-sink load unit 240, and cost unit 260 to process.

According to an embodiment of the present invention, if signal integrity constraints are present, the routing unit 200 may insert additional buffers to limit capacitive loading of a given connection and/or intelligently select a branching point of a new connection. At every point of expansion, the router unit 200 may monitor the total capacitive load of a first upstream buffer or source and compare it with a maximum allowed capacitive load of the buffer or source. The capacitive load may be determined by summing the actual lookbehind load introduced from all previous branches and the current path (from the last buffer to the current expansion point) as well as the lookahead loading. The lookahead loading may be a prediction of how much loading will be introduced by the future portion of the current connection (from the current expansion point to the destination).

According to an embodiment of the present invention, this procedure may be extended to account for situations when the delay-optimal buffer placement results in future capacitive loading which violates maximum driver capacitive loading or maximum transition time constraints. Future delay may be calculated based on a reduced rebuffering distance which is selected to prevent capacitive loading and transition time violations.

A function that evaluates capacitive loading cost with respect to a capacitive loading constraint may be represented as shown below.

target capacitive loading←B * (maximum allowed capacitive loading);
if ((current capacitive loading) < (target capacitive loading)) {
    driver capacitive loading cost component←0;
} else {
    driver capacitive loading cost component←A * ((current capacitive loading)−(target capacitive loading))$^{beta}$;
}

The coefficient B may be selected to be a value less then one and exponent beta may be set to a value higher then one. In a preferred implementation, beta is 2. It should be appreciated that additional penalty may be added to the driver capacitive loading cost component if the current capacitive loading is higher then maximum capacitive loading. The additional penalty may be set to infinity, which will effectively prune the expansions that violate the maximum capacitive loading constraint. Alternatively, expansions which violate the maximum loading constraint can be accepted, but final solutions that violate these constraints can be marked as illegal.

The same approach can be used to limit transition time. In one preferred implementation, the maximum allowed capacitive loading for a driving cell or buffer is selected to guarantee the connection transition time is less than the required maximum transition time with sufficiently high probability. The exact value of the maximum allowed capacitance can be selected as a result of benchmarking and simulation. This approach provides a fast, scalable algorithm which does not require transition time propagation through cells.

According to an embodiment of the router unit 200, the router manager 210 may select connections with the tightest timing constraints (e.g. least slack) to be routed first to allow connections to critical destinations to claim optimal routing resources. Exemplary pseudo code that performs ordering of the connections to route in a net is shown below.

for a given net:
    ordered destinations←select destination ordering;
    partial routing tree←signal source;
    foreach destination from ordered destinations {
        new branch←route from (partial routing tree) to (destination);
        partial routing tree←(partial routing tree)∪(new branch);
        foreach node from partial routing tree {
            worst timing sink[node] ←find worst timing sink that would be slowed down if additional branch is attached to node;
            number of critical sinks[node] ←find number of critical or nearly critical sinks that would be slowed down if additional branch is attached to node;

According to an alternative embodiment of the router 200, a connection ordering may be selected such that the destinations with the tightest timing constraints are routed last to allow better timing modeling during routing of the critical connection. During routing of the critical connection all non-critical connections are already routed. As a result, router unit 200 can observe the exact loading introduced by other destinations and avoid branching from routing resource nodes where this loading would lead to poor timing. Furthermore, router unit 200 will have a better view of the coupling capacitance during the routing of critical connections because most connections are already routed by the time the critical connections are routed. In another alternative embodiment of the router unit 200, a connection ordering may be selected according to the locations of the destinations to allow the router unit 200 to create better routing trees and therefore minimize the number of required buffers. This implementation may be most suitable for non-timing critical nets where wire length and the number of required buffers are the most important quality metrics.

The routing unit 200 may calculate and record unused delay slack for each routed connection. Unused delay slack may be determined to be a difference between delay allocated or budgeted for a given connection and the actual delay achieved by the router unit 200 and may be a positive or negative value. A routed connection or a set of routed connections with the smallest unused delay slack may be selected as the worst-affected connections for a node. According to alternate embodiments, a routed connection or set of routed connections with the smallest allocated delay slack, or the highest criticality is selected as the worst-affected connections for a node. The cost of expansion is adjusted to account for the slowdown introduced by the new expansion (routing branch) on previously routed connections. One possible implementation of the cost component related to slowdown introduced by the new routing branch (alien penalty) is shown below.

cost←(other cost components);
foreach alien sink from worst affected connections {
    alien sink penalty←A * (max(0, (additional slowdown for alien sink) − (unused delay slack of alien sink)))$^{beta}$;
    cost←cost+(alien sink penalty);
}

Alien sink penalty may be adjusted to account for the unused delay slack of the connection currently being routed. One possible implementation of this penalty can be expressed as shown below.

alien slowdown measure←max(0, (additional slowdown for alien sink) − (unused delay slack of alien sink));

own slowdown measure←max(0, (total delay) − (current connection delay budget));

sink penalty←A*(max(0, (alien slowdown measure) − (own slowdown measure))$^{beta}$;

Alternatively, the expansion of a node can be pruned if the alien slowdown measure becomes positive. This completely forbids slowdown of a critical connection by later routing branches. Alternatively, if the router is using connection criticalities, the sink penalty can be determined with the relationship shown below.

if (worst affected sink criticality≧current connection criticality){sink penalty←A * ((worst affected sink criticality)−(current connection criticality))$^{alpha}$ * (additional slowdown for alien sink)$^{beta}$;
} else {
sink penalty←0;
}

Figure 4:
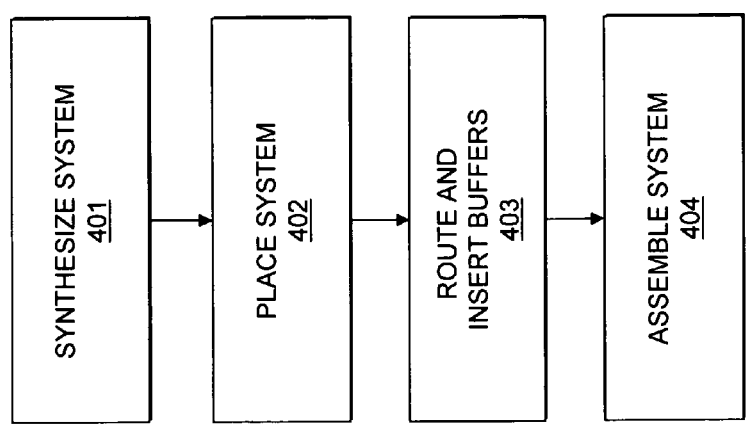
FIG. 4 is a flow chart illustrating a method for designing a system on an integrated circuit according to an embodiment of the present invention.

In the relationship above, both alpha and beta may be positive numbers or zero. Furthermore, if router is using the Elmore delay model, additional slowdown of the alien sink can be calculated using the following expression:

additional slowdown for alien sink←(upstream resistance from branch point to first buffer or net source) * (downstream capacitance of the new expansion from branch point to first buffer or sink);

FIG. 4 is a flow chart illustrating a method for designing a system on an integrated circuit according to an embodiment of the present invention. The integrated circuit may be an ASIC, FPGA, or other circuit. At 401, the system is synthesized. Synthesis includes generating a logic design of the system to be implemented by an integrated circuit. According to an embodiment of the present invention, synthesis generates an optimized logical representation of the system from a HDL design definition. The optimized logical representation of the system may include a representation that has a minimized number of functional blocks and registers, such as logic gates and logic elements, required for the system. Synthesis also includes mapping the optimized logic design. Mapping includes determining how to implement logic gates and logic elements in the optimized logic representation with specific resources on the integrated circuit. According to an embodiment of the present invention, a netlist is generated from mapping. This netlist may be an optimized technology-mapped netlist generated from the HDL.

At 402, the mapped logical system design is placed. Placement works on the optimized technology-mapped netlist to produce a placement for each of the functional blocks. According to an embodiment of the present invention for an integrated circuit chip that is a structured ASIC, placement includes fitting the system on the integrated circuit by determining which resources on the integrated circuit are to be used for specific logic elements, and other function blocks.

At 403, routing and buffer insertion (buffer placement) is performed. Routing and buffer insertion involves determining which routing resources to use to connect the functional blocks in the system and where to insert buffers. According to an embodiment of the present invention, routing options are selected based on assessing the utility of buffer insertion with each routing resource available. A cost function may be used to generate a cost associated with each routing option. The cost function may take into account, delay, capacitive loading, cross-sink loading, power, and/or other criteria.

At 404, an assembly procedure is performed. The assembly procedure involves creating a data file or set of files that includes information determined by the fitting procedure described by 401-404. The data file may be a bit stream that may be used to program the integrated circuit or a set of layout masks used to manufacture the device.

Figure 5A:
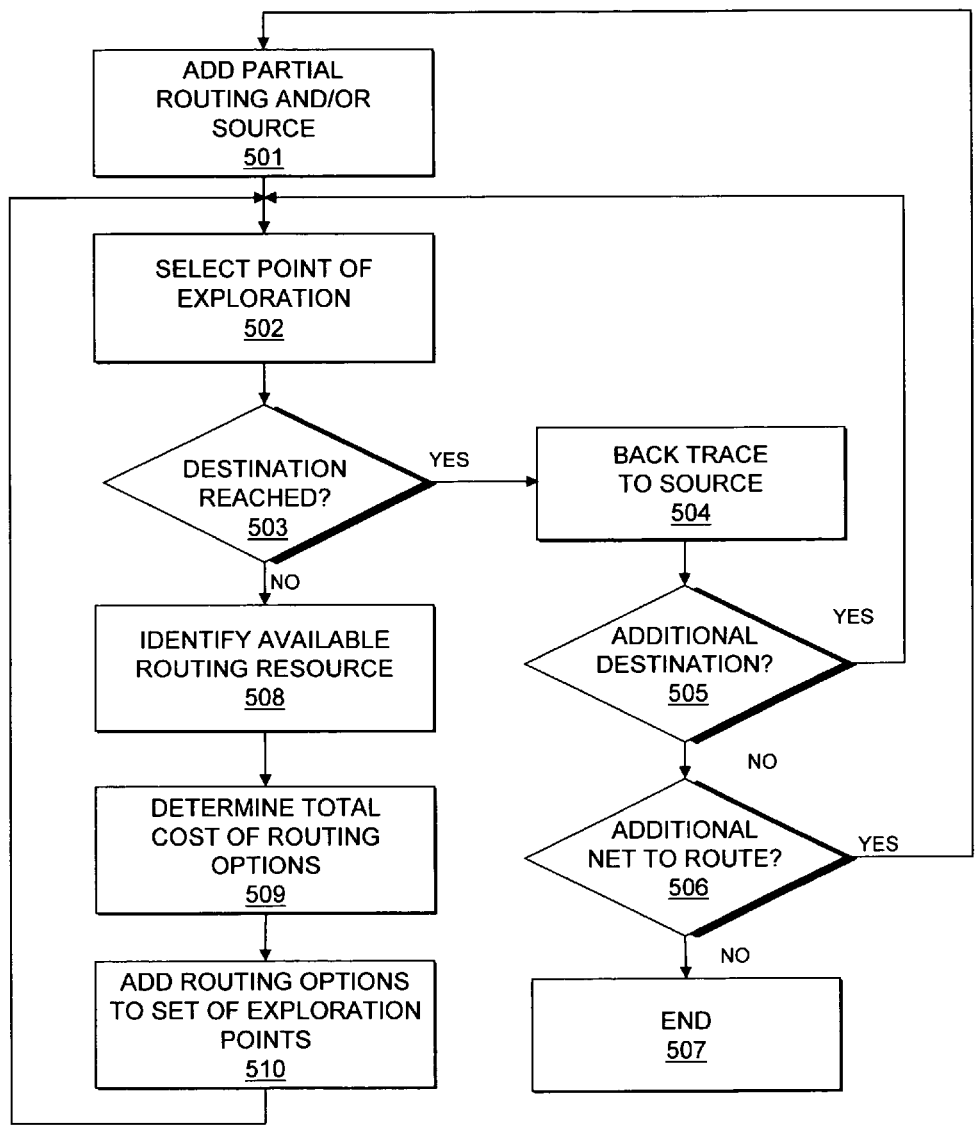
FIG. 5A is a flow chart illustrating a method for performing routing and buffer insertion according to an embodiment of the present invention.

FIG. 5A is a flow chart illustrating a method for performing routing and buffer insertion (buffer placement) according to an embodiment of the present invention. The procedure shown in FIG. 5A may be used to implement 403 shown in FIG. 4 and may be performed by the routing unit 200 shown in FIG. 2. Within a context of a router that utilizes negotiated congestion to resolve conflicts of multiple nets competing for the same resource, the procedure shown on FIG. 5A can be used to implement 902 shown on FIG. 9.

At 501, partial routing and/or a signal source is added to a set of available routing options for routing a net.

At 502, a routing option from the set is selected to determine a point of exploration. The routing option is selected based on a total cost assigned to it. According to an embodiment of the present invention, the routing option with the lowest total cost may be selected. If only a single routing option without a total cost, such as a source, is in the set during an initial run of the procedure, the single routing option is selected. The selected routing option is removed from the set.

At 503, it is determined whether a destination (sink) for the net has been reached with the previous routing option selection. If a destination for the net has been reached, control proceeds to 504. If a destination for the net has not been reached, control proceeds to 508.

At 504, back tracing is performed to the source to determine the routing options to select for routing the net. According to an embodiment of the present invention, every routing option in the set of routing options to explore is assigned a back pointer to the location it was reached from. Traversal of the back pointers may be performed to back trace a routing path. According to an alternate embodiment of the present invention, every routing option, E, is assigned a pointer to the routing option that reaches E with the lowest total cost. Traversal of the pointers from the destination may be performed to back trace a routing path.

At 505, it is determined whether an additional destination for a net being routed is present. If an additional destination is to be routed, control returns to 502. If an additional destination is not to be routed, control proceeds to 506.

At 506, it is determined whether additional net that should be routed is present. If an additional net is to be routed, control returns to 502. If an additional net is not to be routed, control proceeds to 507

At 507, control terminates procedure as shown at 507.

At 508, available routing resources from the point of exploration is identified. The routing resources may include wires of differing lengths, directions, and/or properties.

At 509, total costs of utilizing routing options are determined. According to an embodiment of the present invention, the routing options include utilizing the routing resources identified at 508 with buffer insertion and utilizing the routing resources identified at 508 without buffer insertion.

At 510 the routing options are added to the set of available exploration points. Control returns to 502.

Figure 5B:
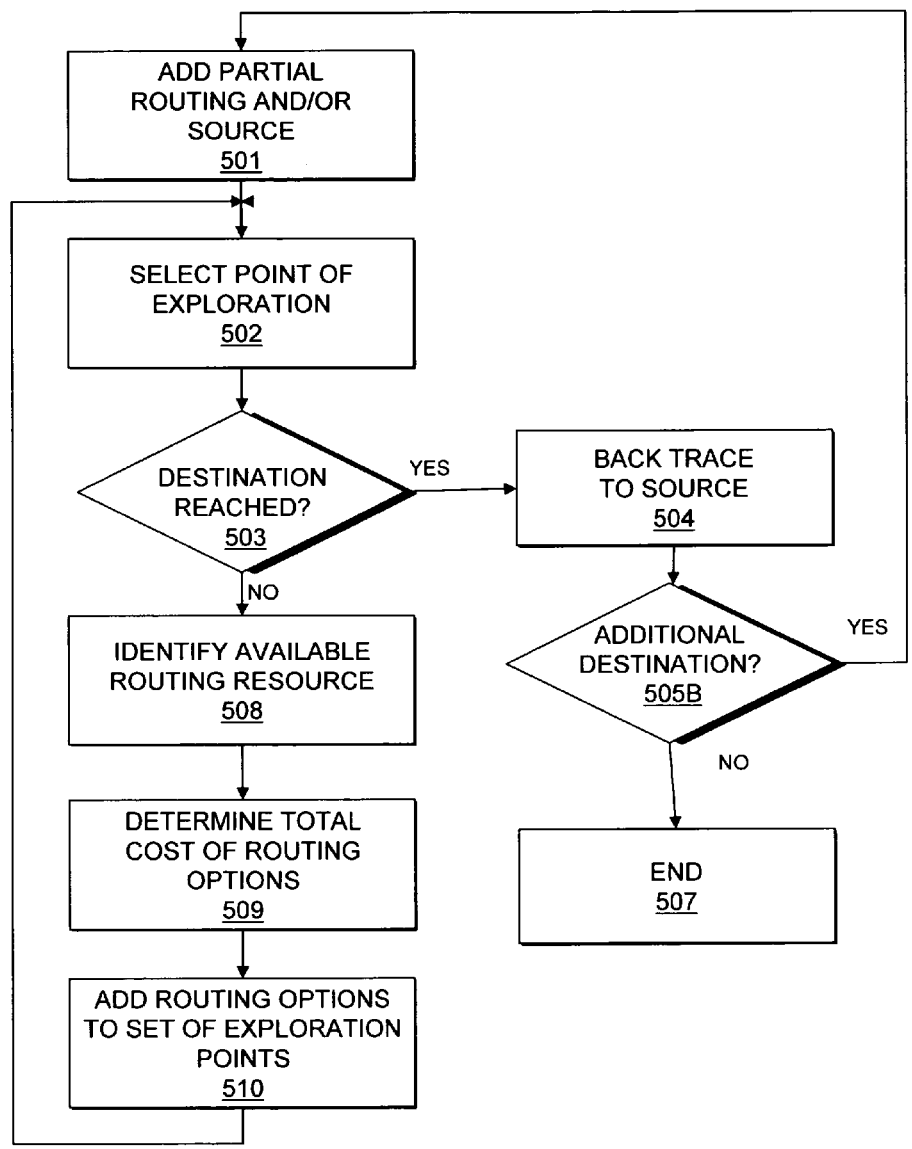
FIG. 5B is a flow chart illustrating a method for performing routing and buffer insertion according to a second embodiment of the present invention.

FIG. 5B is a flow chart illustrating a method for performing routing and buffer insertion (buffer placement) according to an alternative embodiment of the present invention. The procedure shown in FIG. 5B may be used to implement 403 shown in FIG. 4 and may be performed by the routing unit 200 shown in FIG. 2.

Functionality of equally numbered blocks on FIG. 5B is equivalent to the functionality of a corresponding block on a FIG. 5A.

At 505B, it is determined whether an additional destination for all nets being routed is present. If an additional destination is to be routed, control returns to 502. If an additional destination is not to be routed, control proceeds to 506.

Figure 6:
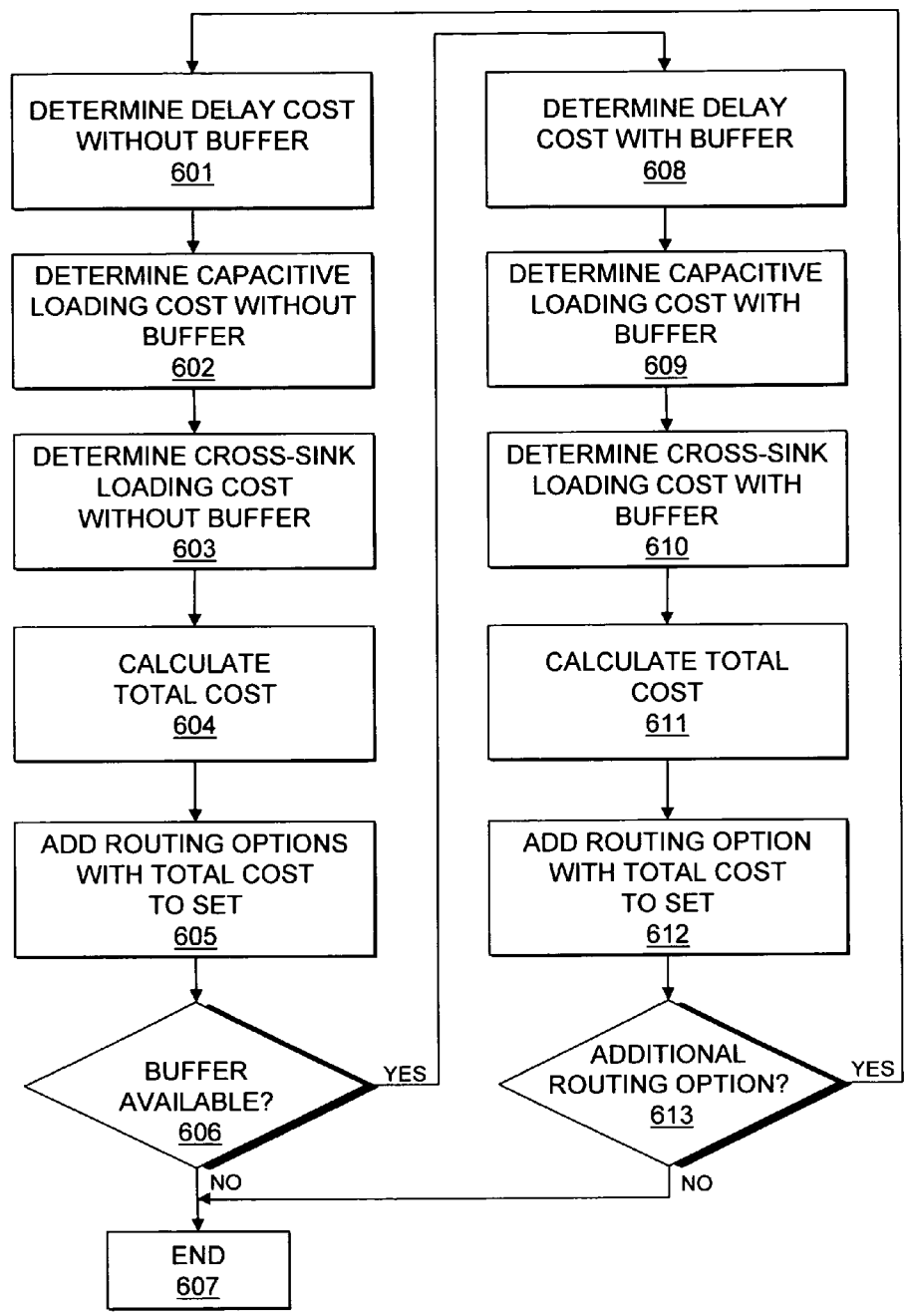
FIG. 6 is a flow chart illustrating a method for costing routing options according to an embodiment of the present invention.

FIG. 6 is a flow chart illustrating a method for determining a total cost for a routing option according to an embodiment of the present invention. The procedure shown in FIG. 6 may be used to implement 509 at FIGS. 5A and 5B. According to an embodiment of the present invention, the procedure in FIG. 6 may be implemented for each routing resource identified. For each routing resource identified, a total cost is determined for a first routing option of using the routing resource without buffer insertion at the routing resource, and a second routing option of using the routing resource with buffer insertion at the routing resource, if buffer insertion is possible.

At 601 a delay cost is determined for a routing option utilizing a routing resource without buffer insertion (future buffered solution). According to an embodiment of the present invention, the delay cost may be calculated by using a first cost function that takes into account the cost and delay of a routing resource up to the point of exploration (backward cost and delay), the cost of the delay of the routing resource at a current point, and the cost and delay of an optimally buffered solution from the point of exploration to the destination of the net (lookahead cost and delay).

At 602, a capacitive loading cost is determined for the routing option utilizing the routing resource without buffer insertion at the routing resource. According to an embodiment of the present invention, the capacitive loading cost of the routing option may be dependent on capacitance of the routing tree driven by a source or buffer connected upstream of the routing resource.

At 603, a cross-sink loading cost is determined for the routing option utilizing the routing resource without buffer insertion at the routing resource. According to an embodiment of the present invention, the cross-sink loading cost accounts for the effect of capacitive loading of the routing option on a routing strategy for another connection or another net.

At 604, a total cost for the routing option is determined. According to an embodiment of the present invention, the total cost associated with the routing option may be determined from the delay cost, capacitive loading cost, cross-sink loading cost, power and/or other criteria. It should be appreciated that the total cost may account for timing, congestion, signal integrity, power consumption, and other factors.

At 605, the routing option and its associated total cost is added to a set of available routing options.

At 606, it is determined whether buffer insertion is available at the routing resource. If buffer insertion is not available, control proceeds to 607. If buffer insertion is available, control proceeds to 608.

At 607, control terminates the procedure.

At 608 a delay cost is determined for a routing option utilizing a routing resource with buffer insertion (immediate buffered solution). According to an embodiment of the present invention, the delay cost may be calculated by using a second cost function that takes into account the cost and delay of a routing resource up to the point of exploration (backward cost and delay), the cost of the delay of the buffer placed at a current point, and the cost and delay of an optimally buffered solution from the point of exploration to the destination of the net (lookahead cost and delay).

At 609, a capacitive loading cost is determined for the routing option utilizing the routing resource with buffer insertion at the routing resource. According to an embodiment of the present invention, the capacitive loading cost of the routing option may depends on capacitance of the routing tree driven by a source or buffer connected upstream of the routing resource.

At 610, a cross-sink loading cost is determined for the routing option utilizing the routing resource with buffer insertion at the routing resource. According to an embodiment of the present invention, the cross-sink loading cost accounts for the effect capacitive loading of the routing option on a routing strategy for another connection or another net.

At 611, a total cost for the routing option is determined. According to an embodiment of the present invention, the total cost associated with the routing option may be determined from the delay cost, capacitive loading cost, cross-sink loading cost, power and/or other criteria. It should be appreciated that the total cost may account for timing, congestion, signal integrity, power consumption, and other factors.

At 612, the routing option and its associated total cost is added to a set of available routing options.

At 613, it is determined whether an additional routing option is to be processed. If no additional routing option is to be processed, control proceeds to 607. If an additional routing option is to be processed, control returns to 601.

Figure 9:
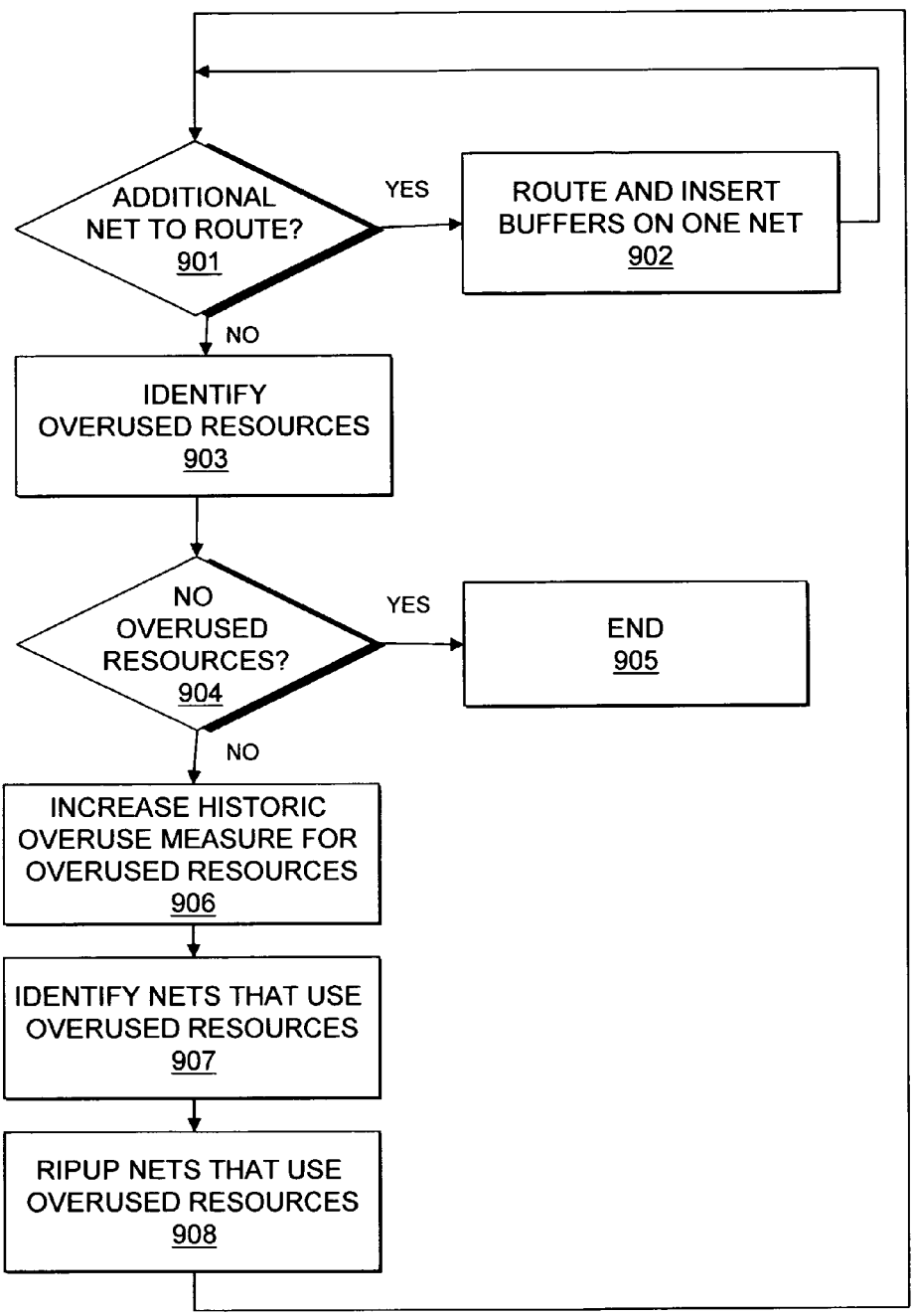
FIG. 9 is a flow chart illustrating a method for performing routing and buffer insertion according to a third embodiment of the present invention.

FIG. 9 is a flow chart illustrating a method for performing routing and buffer insertion (buffer placement) for multiple nets including negotiated resolution of congestion caused for multiple nets competing for the same set of routing resources, according to an embodiment of the present invention. It should be appreciated that set of routing resources can include wires and buffers. The procedure shown in FIG. 9 may be used to implement 403 shown in FIG. 4 and may be performed by the routing unit 200 shown in FIG. 2.

At 901, it is determined whether an additional net needs to be routed. If no additional net is to be routed, control proceeds to 903. If an additional net is to be routed, control proceeds to 903.

At 902, the net is routed and buffers are being inserted on the net. The procedure shown on FIG. 5A may be used to implement 902. Control returns to 901.

At 903, the overused resources are identified. A specific resource, which can include wire and buffer resource, may be is overused if a number of different nets that utilize the resource in the net routing is larger than the number of different nets that can be accommodated by the resource.

At 904, is it determined whether any overused resources were identified. If no overused resource is identified, control proceeds to 905. If an overused resource is identified, control proceeds to 906.

At 905, control terminates the procedure.

At 906, historic overuse measure is increased for all resources that have been identified by 903.

At 907, nets that use resources identified by 903 are determined.

At 908, nets identified by 907 are ripped up and marked to be rerouted by step 901. Control returns to 901.

FIGS. 4-6 and 9 are flow charts illustrating methods according to embodiments of the present invention. The techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

It should be appreciated that the techniques (for synthesis, placement, routing, etc.) may be used in any EDA tool for the creation/processing/optimization/implementation of any electronic design, such as that encountered in the creation of ASICs, FPGAs, or other circuits.

Figure 7:
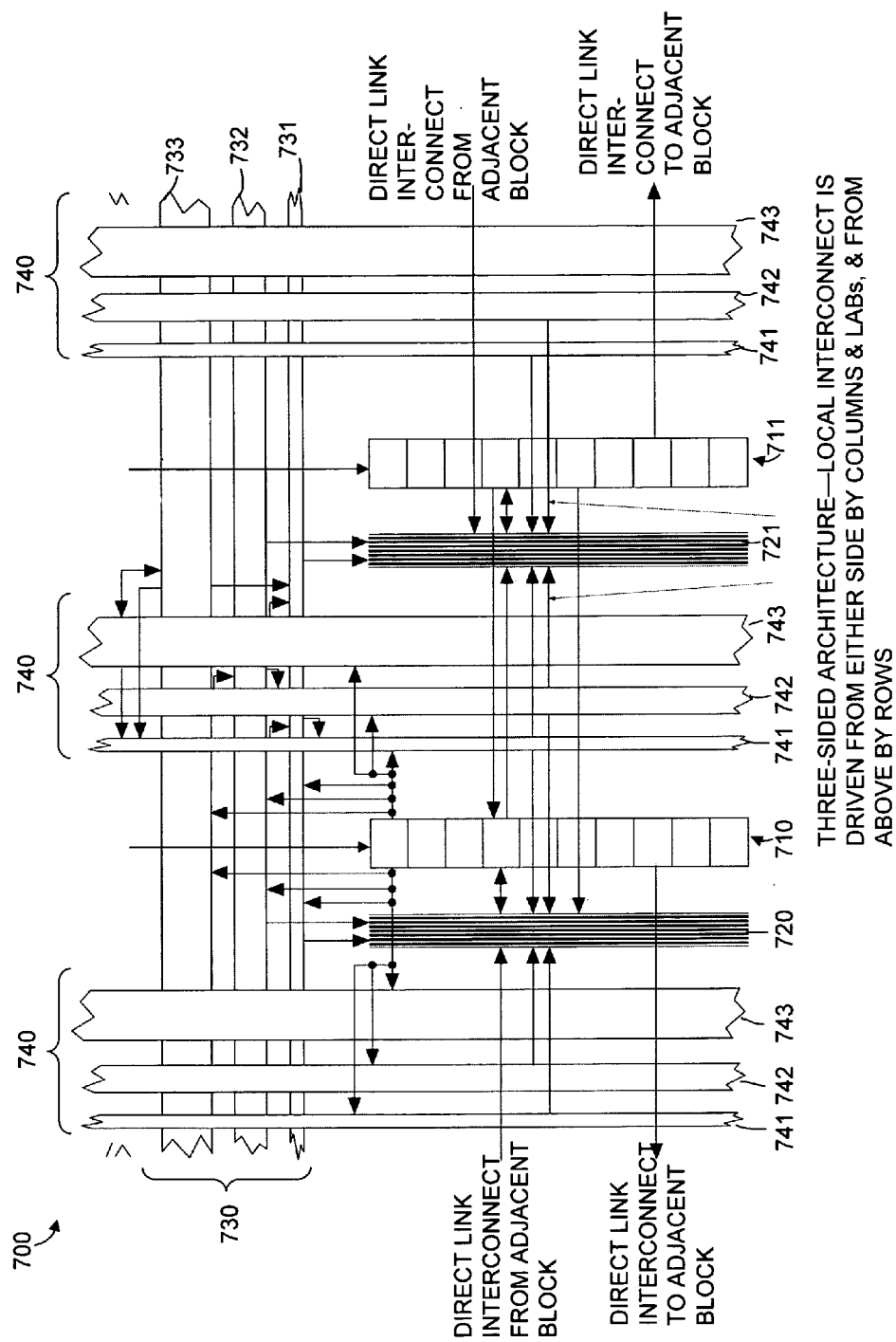
FIG. 7 illustrates an exemplary integrated circuit according to a first embodiment of the present invention.

FIG. 7 illustrates an exemplary integrated circuit 700 according to an embodiment of the present invention. The present invention may be used to design a system onto the integrated circuit 700 which is an FPGA. According to one embodiment, the integrated circuit 700 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the integrated circuit 700, an LE may include a 4-input lookup table (LUT) with a configurable flip-flop.

The integrated circuit 700 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the integrated circuit 700. A first column of LABs is shown as 710 and a second column of LABs is shown as 711.

The integrated circuit 700 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the integrated circuit in between selected LABs or located individually or in pairs within the integrated circuit 700.

The integrated circuit 700 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the integrated circuit 700.

The integrated circuit 700 includes a plurality of input/output elements (IOEs) (not shown). Each IOE feeds an I/O pin (not shown) on the integrated circuit 700. The IOEs are located at the end of LAB rows and columns around the periphery of the integrated circuit 700. Each IOE includes a bidirectional I/O buffer and a plurality of registers for registering input, output, and output-enable signals. When used with dedicated clocks, the registers provide performance and interface support with external memory devices, for example.

The integrated circuit 700 includes LAB local interconnect lines 720-721 that transfer signals between LEs in the same LAB. The LAB local interconnect lines are driven by column and row interconnects and LE outputs within the same LAB. Neighboring LABs, memory blocks, IOEs, or DSP blocks may also drive the LAB local interconnect lines 720-721 through direct link connections.

The integrated circuit 700 also includes a plurality of row interconnect lines ("H-type wires") 730 that span fixed distances. Dedicated row interconnect lines 730, that include H4 731, H8 732, and H24 733 interconnects, route signals to and from LABs, DSP blocks, IOEs, and memory blocks within the same row. The H4 731, H8 732, and H24 733 interconnects span a distance of up to four, eight, and twenty-four LABs respectively, and are used for fast row connections in a four-LAB, eight-LAB, and twenty-four-LAB region. The row interconnects 730 may drive and be driven by LABs, DSP blocks, RAM blocks, and horizontal IOEs.

The integrated circuit 700 also includes a plurality of column interconnect lines ("V-type wires") 740 that operate similarly to the row interconnect lines 730. The column interconnect lines 740 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 740 include V4 741, V8 742, and V16 743 interconnects that traverse a distance of four, eight, and sixteen blocks respectively, in a vertical direction. It should be appreciated that buffer placement may be performed on any one of the interconnect lines described.

FIG. 7 illustrates an exemplary embodiment of an integrated circuit. It should be appreciated that a system may include a plurality of integrated circuits, such as that illustrated in FIG. 7, cascaded together. It should also be appreciated that the integrated circuit may include programmable logic devices arranged in a manner different than that on the integrated circuit 700. An integrated circuit may also include components other than those described in reference to the integrated circuit 700. Thus, while the invention described herein may be utilized on the architecture described in FIG. 7, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Figure 8:
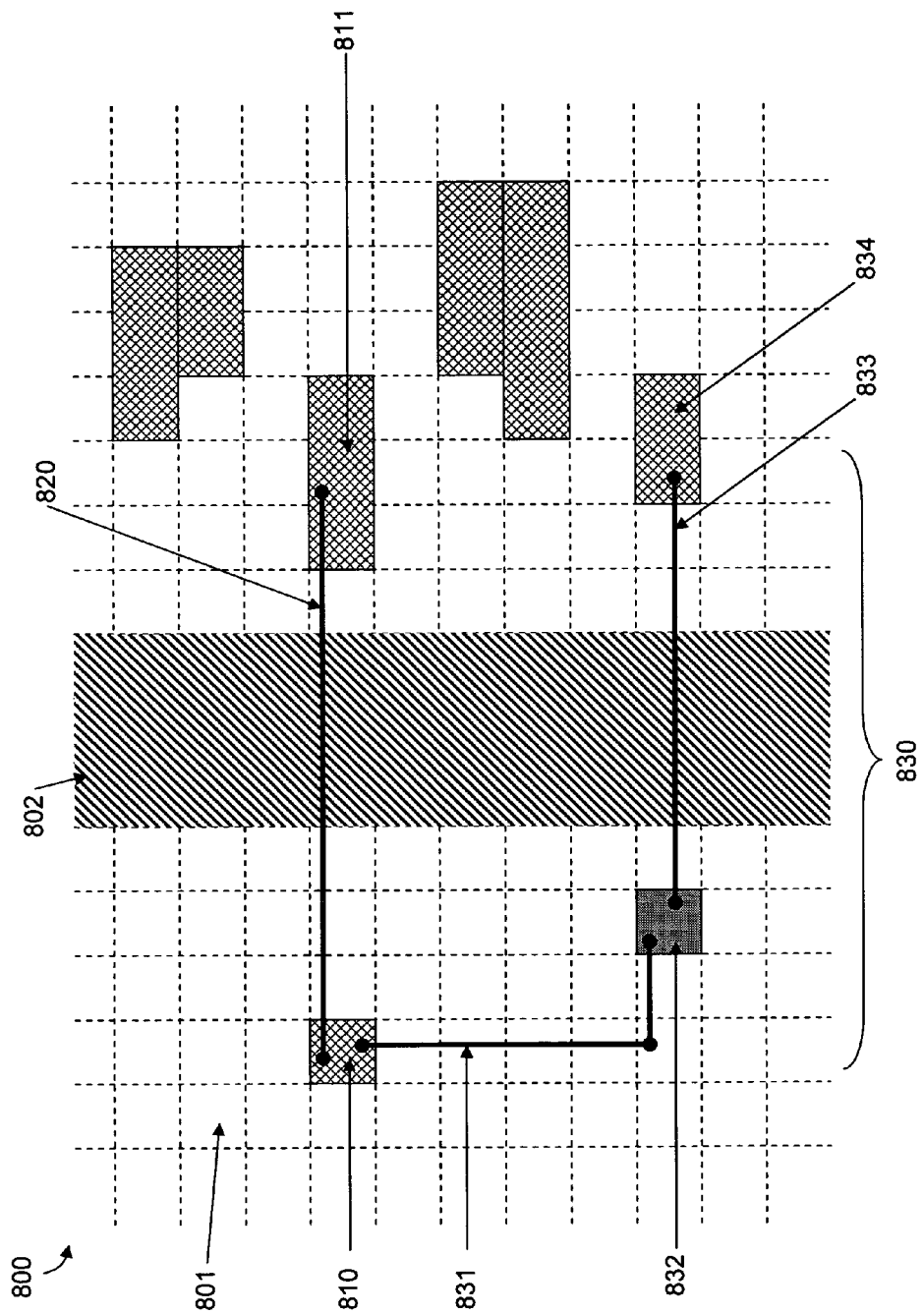
FIG. 8 illustrates an exemplary chip device according to a second embodiment of the present invention.

FIG. 8 illustrates an embodiment of a chip 800 according to a second embodiment of the present invention. An embodiment of the present invention may be used to design a system onto the chip 800 which is a structured ASIC. A structured ASIC is a hybrid device that includes a number of pre-defined or pre-built layers used to define logic fabric and IP blocks, and a number of customizable design-specific layers used to provide connectivity in the logic fabric and to/from IP blocks.

According to one embodiment, the structured ASIC 800 may include partially-regular structures of pre-built sites which define the logic fabric. One or more sites can be used to implement simple logic functionality, such as combinational and sequential blocks. For example, block 810 is implemented using a single site, while block 811 is shown implemented using 3 sites. It should be appreciated that one or more sites may be configured to implement a buffer.

The structured ASIC 800 may include embedded IP blocks such as RAM, DSP, and/or IO such as that shown at 802. Customizable layers may be used to connect logical blocks with other logical blocks and with IP blocks.

Route 820 illustrates an exemplary connection between two logical blocks. Routes can optionally be re-buffered: Route 830 is an example of a re-buffered route. Route 830 includes a start segment 831, which is driven by a source logic block 810, inserted buffer 832, and end routing segment 833, which is driven by the inserted buffer. The end routing segment 833 directly drives signal destination 834.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on an integrated circuit, comprising:
    synthesizing the system;
    placing the system on the integrated circuit; and
    performing buffer insertion while selecting new branch points during routing of the system by identifying routing options that include routing resources with buffers and without buffers, determining a total cost for each of the routing options, and selecting a routing option, from a set of available routing options based on total cost by determining a delay cost, from which to identify additional routing options, wherein determining the delay cost for a routing option with a buffer includes accounting for a cost and delay of a routing resource up to a point of exploration, a cost of a delay of the buffer placed at a current point, and a cost and delay of an optimally buffered solution from the point of exploration to the destination of the net.

2. The method of claim 1, further comprising removing a selected routing option from the available set.

3. The method of claim 1, further comprising:
    determining whether a destination has been reached; and
    back tracing to a source to determine a routing path in response to reaching the destination.

4. The method of claim 1, wherein determining the total cost for each of the routing options further comprises determining capacitive loading cost for the routing options.

5. The method of claim 1, wherein determining the total cost for each of the routing options further comprises determining cross-sink loading costs for the routing options.

6. The method of claim 1, wherein determining the total cost comprises accounting for satisfying maximum capacitive loading constraints when evaluating delay cost.

7. The method of claim 1, wherein performing buffer placement with routing of the system, comprises:
    identifying overused resources; and
    re-routing nets that use the overused resources.

8. The method of claim 7, wherein re-routing the nets comprises selection of wires and buffers.

9. The method of claim 1, wherein determining the total cost for each of the routing options comprises determining a hold time margin.

10. A method for designing a system on an integrated circuit, comprising:
    synthesizing the system;
    placing the system on the integrated circuit; and
    performing buffer insertion while selecting new branch points during routing of the system by identifying routing options that include routing sources with buffers and without buffers, determining a total cost for each of the routing options, and selecting a routing option, from a set of available routing options based on total cost by determining a delay cost, from which to identify additional routing options, wherein determining the delay cost for a routing option without a buffer includes accounting for a cost and delay of a routing resource up to the point of exploration, a cost of a delay of the routing resource at a current point, and a cost and delay of an optimally buffered solution from the point of exploration to the destination of the net.

11. A method for designing a system on an integrated circuit, comprising:
    synthesizing the system;
    placing the system on the integrated circuit; and
    performing buffer insertion while selecting new branch points during routing of the system by assigning total costs to a first plurality of routing options that include routing resources utilizing buffers, assigning total costs to a second plurality of routing options that include the routing resources not utilizing the buffers, and exploring additional routing options based on the total costs of the first and second plurality of routing options, wherein assigning the total costs to the first plurality of routing options that include the routing resources utilizing the buffers includes assigning a first total cost to a first routing option that includes a first routing resource utilizing a first buffer having a first property and assigning a second total cost to a second routing option that includes the first routing resource utilizing a second buffer having a second property.

12. A method for designing a system on an integrated circuit, comprising:
    synthesizing the system;
    placing the system on the integrated circuit; and
    performing buffer insertion while routing the system by identifying routing options that include using routing resources with buffers and without buffers, determining a total cost for each of the routing options, and selecting a routing option, from a set of available routing options based on total cost, from which to identify additional routing options, wherein determining the total cost includes determining a delay cost for a routing option with a buffer that includes accounting for a cost and delay of a routing resource tip to a point of exploration, a cost of a delay of the buffer placed at a current point, and a cost and delay of an optimally buffered solution from the point of exploration to the destination of the net.

13. A method for performing buffer insertion on an integrated circuit, comprising:
    identifying routing options that include using routing resources with buffers and without buffers;
    determining a total cost for each of the routing options that includes accounting for a cost and delay of a routing resource up to the point of exploration, a cost of a delay of a routing resource at a current point and alternatively a buffer placed at the current point, and a cost and delay of an optimally buffered solution from the point of exploration to a destination of the net; and
    selecting a routing option, from a set of available routing options based on total cost, from which to identify additional routing options.

14. The method of claim 13, wherein determining the total cost for each of the routing options comprises determining capacitive loading cost for the routing options.

15. The method of claim 13, wherein determining the total cost for each of the routing options comprises determining cross-sink loading costs for the routing options.

16. The method of claim 13, wherein determining the total cost comprises accounting for satisfying maximum capacitive loading constraints when evaluating delay cost.

17. The method of claim 13, wherein determining the total cost for each of the routing options comprises determining a hold time margin.

18. A system designer, comprising:
   a synthesis unit to generate a logic design of a system to be implemented by an integrated circuit;
   a placement unit to determine where to implement functional blocks of the logic design on the circuit; and
   a routing unit to identify routing options that includes using routing resources with buffers and without buffers, determine a total cost for each of the routing options that includes a cost and delay of an optimally buffered solution from a point of exploration to a destination of the net, and selecting a routing option, from a set of available routing options based on total cost, from which to identify additional routing options.

19. The system designer of claim 18, wherein the routing unit comprises a capacitive load unit to generate a capacitive loading cost for a first routing option that includes utilizing a routing resource with a buffer, and a capacitive loading cost for a second routing option that includes utilizing the routing resource without a buffer.

20. The system designer of claim 18, wherein the routing unit comprises a cross-sink loading unit to generate a cross-sink loading cost for a first routing option that includes utilizing a routing resource with a buffer, and a capacitive loading cost for a second routing option that includes utilizing the routing resource without a buffer.

21. The system designer of claim 18, wherein the routing unit comprises a cost unit to generate a total cost for each of the routing options based on a delay cost, capacitive loading cost, and cross-sink loading cost of the routing options.

* * * * *